United States Patent [19]

Grünwald et al.

[11] Patent Number: 5,009,708

[45] Date of Patent: Apr. 23, 1991

[54] PRINTING PASTE AND METHOD OF APPLYING SAID PASTE

[75] Inventors: Werner Grünwald, Gerlingen; Gerhard Holfelder, Weissach; Claudio De La Prieta, Stuttgart; Kurt Schmid, Ditzingen, all of Fed. Rep. of Germany

[73] Assignee: Robert Bosch GmbH, Stuttgart, Fed. Rep. of Germany

[21] Appl. No.: 403,040

[22] Filed: Aug. 31, 1989

Related U.S. Application Data

[63] Continuation of Ser. No. 270,395, Nov. 10, 1988, abandoned, which is a continuation of Ser. No. 133,157, Dec. 11, 1987, abandoned, which is a continuation of Ser. No. 919,626, Oct. 15, 1986, abandoned, which is a continuation of Ser. No. 802,077, Nov. 26, 1985, abandoned, which is a continuation of Ser. No. 613,567, May 24, 1984, abandoned, which is a continuation-in-part of Ser. No. 427,601, Sep. 29, 1982, abandoned.

[30] Foreign Application Priority Data

Nov. 17, 1981 [DE] Fed. Rep. of Germany ....... 3145583

[51] Int. Cl.$^5$ ............................ C09D 5/10; C23C 20/04
[52] U.S. Cl. ....................................... 106/105; 106/20; 106/26; 106/174; 106/203; 252/514; 252/520

[58] Field of Search ............... 252/514, 520; 106/1.05, 106/20, 26, 174, 175, 194, 203, 204

[56] References Cited

U.S. PATENT DOCUMENTS

| 3,440,062 | 4/1969 | Hoffman | 106/1 |
| 4,021,326 | 5/1977 | Pollner et al. | 204/195 S |

FOREIGN PATENT DOCUMENTS 3002112 7/1981 Fed. Rep. of Germany .

*Primary Examiner*—Amelia Burgess Yarbrough
*Attorney, Agent, or Firm*—Frishauf, Holtz, Goodman & Woodward

[57] ABSTRACT

A printing paste suitable for application by an elastically deformable stamp on a substrate and method for said application. The paste comprises a powdered solid component in an organic carrier with a weight ratio of between 6:4 and 8:2. The organic carrier comprises 4–9% by weight ethyl cellulose, 74–82% alpha-terpineol, and 8–17% benzyl alcohol. The paste may also contain up to 20% by weight of polyethylene glycol. The solid component of the paste is preferably a mixture of platinum and zirconium dioxide which can be applied as an electrically conductive paste to form a conductive coating on a substrate, preferably a tubular or other substrate having a non-planar surface. The paste has a viscosity of between 6 and 8.5 pascal seconds.

19 Claims, No Drawings

PRINTING PASTE AND METHOD OF APPLYING SAID PASTE

This application is a continuation of application Ser. No. 07/270,395 filed Nov. 10, 1988 (abandoned); which is a continuation of application Ser. No. 07/133,157 filed Dec. 11, 1987 (abandoned); which is a continuation of application Ser. No. 06/919,626 filed Oct. 15, 1986 (abandoned); which is a continuation of application Ser. No. 06/802,077 filed Nov. 26, 1985 (abandoned); which is a continuation of application Ser. No. 06/613,567 filed May 24, 1984 (abandoned); which is a continuation-in-part of application Ser. No. 06/427,601 filed Sept. 29, 1982 (abandoned).

The present invention relates to printing paste and to a method of applying said paste, and more particularly to a printing paste which can be applied on substrate or carrier by means of an elastically deformable applicator, for example in the form of a stamp.

BACKGROUND

Printing pastes which are electrically conductive are known; such printing pastes with predetermined conductivity may include, besides ethyl cellulose, alpha-terpineol, and benzyl alcohol, and a polyester as a substantial portion. By suitable selection of additives, the extent of electrical conductivity can be controlled (see German Patent Disclosure Document DE-OS No. 30 02 112). These printing pastes can be applied in selected patterns on predetermined regions of a substrate, for example made of glass or ceramic, by using screen printing technology. Other pastes, which are commercially available, can be similarly applied. Difficulties have been experienced in screen printing such pastes if the substrate is not planar or flat, for example is in the form of a tube with small diameter of, for example, 1-2 cm diameter. It is known that such substrates can have printed ink applied thereto by using an elastically deformable stamp, in which the ink is taken up by the stamp in form of a pattern in a predetermined quantity and geometric shape, and transferred on the substrate on which printing is to be effective. The stamp, for example, may be made of silicone rubber. It has been attempted to utilize the stamp-printing method, known as ink transfer, with printing pastes which are electrically conductive in order to make electrical components which, for example, have tubular shapes. It has been found that the electrical conductive pastes which are known, and which are suitable for use in screen printing, are unsuited for printing methods which were suitable for use with printing ink, since the transmissibility of these pastes from the elastically deformable stamp—typically in accordance with the prior art made of silicone rubber—is insufficient for transfer of paste to substrates made of ceramic or glass. It had been believed that the commercially available pastes, suitable for screen printing, need only be thinned somewhat in order to make them suitable for printing with an elastically deformable stamp. It has been found, however, that merely thinning the paste will not lead to the solution of the problem of application of the paste to the substrate.

THE INVENTION

It is an object of the present invention to provide a paste, and preferably an electrically conductive paste, which can be applied by an elastically deformable stamp by a stamp-printing process on substrates which are other than planar, for example tubular, and more particularly tubes of diameters in the order of between 1-2 cm, or even smaller, for example for application of conductive regions or tracts on the tubular combustion exhaust gas sensor, for example to provide an electrical signal representative of the presence of oxygen in combustion exhaust gases, especially from an internal combustion engine.

Briefly, a paste is provided in which the mixing ratio of solid components, or solid component mixtures to the organic carrier, with respect to weight, is between 6:4 and 8:2. The organic carrier comprises 4 to 9% ethyl cellulose, 73 to 82% alpha-terpineol and 5 to 17% benzyl alcohol, all propostions by weight. Preferably the organic carrier comprises 5.5 to 6.5% ethyl cellulose, 78 to 81% alpha-terpineol, and 13 to 16% benzyl alcohol. Up to about 20% by weight of polyethylene glycol may be added. A particularly good paste has about 6% ethyl cellulose, about 79% alpha-terpineol and about 15% benzyl alcohol by weight.

The solids, or a mixture of solids is a metal powder, and/or a ceramic powder, and/or a glass powder, and/or a compound. In a mixture of solids, the metal, for example, being platinum, a typical ceramic being zirconium dioxide, a mixing ratio—by volume—of platinum to zirconium dioxide of about between 50:50 and 80:20. The solid compound may also be fully stabilized zirconium dioxide. The proportion of platinum, by weight, of the overall weight of the paste may be between 60 and 70%, preferably about 64%.

The paste of the present invention has a viscosity of between 6 and 9 pascal(Pa)×sec preferably the viscosity is between 6 and 8.5 Pa·sec and more preferably between 6.8 and 8 Pa·sec.

The paste in accordance with the present invention has the advantage that it has excellent characteristics with respect to transfer from an elastically deformable stamp, by a stamp-printing process on a ceramic or glass substrate. The paste, thus, can readily be applied by printing systems which are well known and utilized for planar electrical circuit components or elements; the paste thus can be applied by use of the elastically deformable stamp also on non-planar substrates, for example small tubes of the type used in exhaust gas sensors in combination with internal combustion engine exhaust gas control systems.

The paste is suitable for use with various types of solids, for example metal powders, ceramic powders, glass powders, as well as mixtures thereof, so that regardless of the solid which is used therewith, conductive layers, resistant layers, or insulating layers can be applied by printing with an elastically deformable stamp, utilizing the paste. For example, the solid may be aluminum oxide and thus an excellent insulating layer can be applied by printing with a deformable stamp or any substrate, whether planar, flat, or of different geometric configuration, for example circular, or of any surface shape other than planar or flat.

In accordance with a particularly preferred composition, a paste is used including an organic carrier of about 6% ethyl cellulose, 79% alpha-terpineol and 15% benzyl alcohol, all proportions by weight. If this should not be sufficient to effectively provide transfer of the paste by stamping to a substrate, from between 1 to 20% of polyethylene glycol can be mixed in. This, however, requires rapid working since the mixture is not as stable as one which does not contain polyethylene glycol.

DETAILED DESCRIPTION

The invention will be described in connection with an electrically conductive paste which is provided, for example, to manufacture conductive connecting tracts or electrodes in exhaust gas composition sensors, applied to ceramic substrates.

This solid component of the paste is a mixture of platinum and zirconium dioxide, in a volumetric relationship of platinum to zirconium dioxide of between about 50:50 and 80:20, and preferably between about 58:42 and 62:38, with the ratio of about 60:40 being particularly preferred. The zirconium dioxide is fully stabilized with yttrium oxide. The platinum should not be too finely comminated. A grain size distribution of more than 70% being between 0.5 and 3 micrometers, with a grain size of about 1 micrometer being particularly preferred.

The zirconium dioxide, likewise, should have a predetermined grain size. The grain size should be sufficiently small to provide a specific surface of between about 8 and 14 square meter per gram, with a particularly suitable grain size having a specific surface of 11 square meters per gram. A good conductive electric layer of platinum with good catalytic characteristics, which is particularly desirable for use with electrodes on exhaust gas sensors is obtained if the proportion of platinum, with respect to the overall weight of the paste, is between about 60 and 70% by weight, with about 64% being particularly preferred. Such sensors are well known, for example as disclosed in U.S. Pat. No. 4,021,326 and U.S. Pat. No. 4,212,720, which are incorporated herein by reference.

EXAMPLE—PREPARATION OF THE PASTE

6% ethyl cellulose, 79% alpha-terpineol and 15% benzyl alcohol—all percentages by weight—are intimately mixed in a three roller mixer. Thereafter, 60% by volume of the aforementioned platinum and 40% by volume of the aforementioned fully stabilized zirconium, well mixed together, is added in the three roller mixer to the previously provided organic carrier, and thoroughly and intimately mixed therewith. The resulting paste can be easily worked and has good storage or shelf characteristics.

It has been found, in general, that use of such a paste in a printing method by using an elastically deformable stamp is highly dependent on the proportion of solids, and on the viscosity of the paste in dependence on the then pertaining mechanical stressing thereof. The presence of ethyl cellulose as a component of the organic carrier has, in general, the function of a binder; the components formed by the alpha-terpineol and the benzyl alcohol in the combination are used to properly control the viscosity, and forms a thixotropic element, which is important.

Similarly, the pastes which were described for use as electrically conductive pastes can be used as resistance paste or insulating paste by suitable selection of the solid components. The organic carrier can be used, universally, for all these pastes which will have the same desirable characteristics with respect to printing-on of patterns, regarding transmissibility and printing capability of the patterns themselves.

A preferred paste has the following composition: 1.5% ethyl cellulose, 19.7% alpha-terpineol, 3.8% benzyl alcohol, 64% platinum having a grain size in the range of about 1 micron, and 11% fully stabilized zirconium dioxide having a specific surface of 11 square meters per gram.

| Paste No.* | Pt Wgt. %* | ZrO$_2$ Wgt. % | Ethyl cellulose | α-terpineol | Benzyl-alcohol | Viscosity A | Viscosity B | Paste Applied (mg) |
|---|---|---|---|---|---|---|---|---|
| 1 | 64.18 | 10.95 | 5.45 | 79.21 | 15.31 | 6.956 | 7.326 | 5.95 ± 0.28 |
| 2 | 64.18 | 10.94 | 7.5 | 77.5 | 15.00 | 7.992 | 8.584 | 4.81 ± 0.31 |
| 3 | 64.18 | 10.94 | 7.5 | 77.5 | 15.00 | Pa . sec | 8.288 | 4.08 ± 0.47 |

*Wgt. % of the paste.
Viscosity A is the viscosity of the paste before stamping.
Viscosity B is the viscosity of the paste after stamping.

The paste noted in the preceding paragraph was applied to the surface of a tubular zirconium dioxide sensor having a length of about 3.5 cm and a radius of about 0.35 cm. The paste was applied in a pattern.

An elastomeric silicone rubber stamp sold by Tampoprint Company, 7015 Munchingen 2, West Germany, having a negative surface imprint, which is the image of the desired pattern to be applied to the tubular surface, was used. The paste was spread on the surface of the stamp. The stamp was then pressed against the tubular surface to apply the paste in the design described hereinbefore. The tubular element having the paste in pattern form on the surface thereof is then heated to a temperature of about 1420° C. to burn off the organic carrier and to cause the solid components thereof to sinter together and to the tubular element, whereby the surface contains the mixture of platinum and zirconium dioxide in a pattern which forms an electrically conductive path on the surface of the tubular element.

Although the paste of the present invention has been provided to meet the particularly demanding requirements of printing with an elastomeric stamp on a substrate having a non-planar surface, the paste may also be applied on planar or other smooth surfaces by an elastomeric stamp.

What is claimed is:

1. A printing paste suitable for application on a non-planar substrate, said paste being a thixotropic paste having a viscosity between about 6 and 8.5 pascal-seconds and consisting essentially of
    a solid component in powder form, and
    an organic carrier consisting essentially of between 4 and 9% by weight ethyl cellulose, between 74 and 82% alpha-terpineol, and between 8 and 17% benzyl alcohol, and
    the relative proportions, by weight, between said solid component and said organic carrier being between 6:4 and 8:2.

2. The paste of claim 1 further comprising polyethylene glycol in an amount up to 20%.

3. The paste of claim 1 having a viscosity between 6.8 and 8 pascal-seconds.

4. The paste of claim 3 wherein said organic carrier consists essentially of between 5.5 and 6.5% ethyl cellulose, between 78 and 81% alpha-terpineol, and between 13 and 16% benzyl alcohol.

5. The paste of claim 1 wherein the solid component comprises at least one material selected from the group consisting of a metal powder, a ceramic powder, a glass powder, a mixture of metal powder and ceramic powder, and a mixture of metal powder and glass powder.

6. The paste of claim 5, for application of electrically conductive patterns on an insulating substrate,
wherein the solid component comprises a mixture of platinum and zirconium dioxide.

7. The paste of claim 3, for application of electrically conductive patterns on an insulating substrate,
wherein the solid component comprises a mixture of platinum and zirconium dioxide.

8. The paste of claim 7 wherein the ratio of platinum to zirconium dioxide is between about 50:50 and 80:20, by volume.

9. The paste of claim 8 wherein the zirconium dioxide is fully stabilized zirconium dioxide.

10. The paste of claim 7 wherein the platinum has a grain size distribution of more than 70% of the platinum grains being between 0.5 and 3 micrometers.

11. The paste of claim 7 wherein the platinum comprises between about 60 and 70%, by weight.

12. The paste according to claim 11 wherein platinum comprises about 64% of the paste.

13. The paste of claim 7 wherein the ratio of platinum to zirconium is between about 50:50 and 80:20 by volume, wherein the platinum comprises between about 60 and 70% by weight of said paste, wherein more than about 70% of said platinum grains are between 0.5 and 3 microns, and wherein the zirconium dioxide is in powder form having a specific surface between 8 and 14 square meters per gram.

14. The paste of claim 11 containing about 64% by weight of platinum and wherein the platinum has a grain size of about 1 micron, and wherein the zirconium dioxide has a specific surface of about 11 meters per gram.

15. The paste of claim 12 wherein the organic carrier consists essentially of about 6% ethyl cellulose, 79% alpha-terpineol, and 15% benzyl alcohol.

16. The paste of claim 7 wherein the paste consists essentially of:
1.5% ethyl cellulose, 19.7% alpha terpineol, 3.8% benzyl alcohol, 64% platinum having a grain size of about 1 micrometer, and
11% fully stabilized zirconium dioxide with a specific surface of 11 square meters per gram, all percentages by weight.

17. The paste of claim 7 wherein the organic carrier consists essentially of about 6% ethyl cellulose, 79% alpha-terpineol, and 15% benzyl alcohol.

18. A method for applying a coating on a substrate comprising printing on said substrate an electrically conductive design formed from the paste of claim 6.

19. A method for applying a coating on a substrate comprising printing on said substrate an electrically conductive design formed from the paste of claim 13.

* * * * *